(12) United States Patent
Ishiguro et al.

(10) Patent No.: US 12,525,868 B2
(45) Date of Patent: Jan. 13, 2026

(54) GATE DRIVE CIRCUIT AND POWER CONVERSION DEVICE USING SAME

(71) Applicant: Mitsubishi Electric Corporation, Tokyo (JP)

(72) Inventors: Yoshiaki Ishiguro, Tokyo (JP); Kohei Onda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/836,379

(22) PCT Filed: Feb. 22, 2022

(86) PCT No.: PCT/JP2022/007362
§ 371 (c)(1),
(2) Date: Aug. 7, 2024

(87) PCT Pub. No.: WO2023/162032
PCT Pub. Date: Aug. 31, 2023

(65) Prior Publication Data
US 2025/0141338 A1    May 1, 2025

(51) Int. Cl.
*H02M 1/08*    (2006.01)
*H03K 17/687*    (2006.01)

(52) U.S. Cl.
CPC ............ *H02M 1/08* (2013.01); *H03K 17/687* (2013.01)

(58) Field of Classification Search
CPC .............................. H02M 1/08; H03K 17/687
USPC .................................................. 327/108, 109
See application file for complete search history.

(56) References Cited

U.S. PATENT DOCUMENTS

| 2004/0027762 A1* | 2/2004 | Ohi .................. H03K 17/08128 |
| | | 361/100 |
| 2008/0012610 A1 | 1/2008 | Aoki et al. |
| 2010/0102857 A1 | 4/2010 | Aoki et al. |
| 2011/0210766 A1 | 9/2011 | Aoki et al. |
| 2012/0182051 A1 | 7/2012 | Aoki et al. |

(Continued)

FOREIGN PATENT DOCUMENTS

JP    2007-288774 A    11/2007

OTHER PUBLICATIONS

Ruedi et al., "New drivers with active clamping for high-power IGBTs", International Conference on Power, Energy and Electrical Engineering, 2000, 3 pages.

(Continued)

*Primary Examiner* — William Hernandez
(74) *Attorney, Agent, or Firm* — XSENSUS LLP

(57) ABSTRACT

The present disclosure includes: a gate drive unit which applies a gate drive voltage to a control terminal of a semiconductor switching element so as to drive the semiconductor switching element; a voltage feedback unit which is connected to a high-potential main terminal of the semiconductor switching element and which causes a voltage of the high-potential main terminal to be fed back to the gate drive unit, the voltage being generated when the semiconductor switching element is turned off; and a discharge unit forming a path through which electric charge included in the voltage feedback unit is discharged to the high-potential main terminal side of the semiconductor switching element when the semiconductor switching element is turned on.

16 Claims, 5 Drawing Sheets

(56) References Cited

U.S. PATENT DOCUMENTS

2015/0280416 A1* 10/2015 Kreuter .................. H02H 3/08
361/55

OTHER PUBLICATIONS

International Search Report and Written Opinion mailed on Apr. 26, 2022, received for PCT Application PCT/JP2022/007362, filed on Feb. 22, 2022, 8 pages including English Translation.

* cited by examiner

GATE DRIVE CIRCUIT AND POWER CONVERSION DEVICE USING SAME

CROSS-REFERENCE TO RELATED APPLICATION

This application is a national stage application, pursuant to 35 U.S.C. § 371, of International Patent Application No. PCT/JP2022/007362, filed Feb. 22, 2022, the entire contents of which is incorporated herein by reference.

TECHNICAL FIELD

The present disclosure relates to a gate drive circuit and a power conversion device using the same.

BACKGROUND ART

In general, it is known that switching loss in a semiconductor of a MOSFET or the like is decreased by decreasing the gate resistance and increasing the switching speed. However, in a case where the switching speed is increased at the time of turn-off, surge voltage that is generated owing to a parasitic inductance in the circuit increases, and, when the surge voltage exceeds a withstand voltage of the semiconductor, such excess leads to a fracture of the semiconductor. That is, the switching loss and the surge voltage at the time of turn-off are in a trade-off relationship.

As a circuit for achieving enhancement regarding this relationship, a circuit has been proposed in which a drain terminal of a MOSFET 30 is connected to an anode terminal of a diode 40 via a capacitor 42, and a gate terminal of the MOSFET 30 is connected to a cathode terminal of the diode 40 (for example, Patent Document 1). In this configuration, when the surge voltage at the time of turn-off exceeds a prescribed voltage, the gate is turned on so as to allow the surge voltage to escape, whereby low loss and low surge voltage are realized.

In addition, as a circuit for achieving increase of responsivity, there has been a circuit having a configuration in which information about the collector voltage of an IGBT is fed back to the input side of a gate drive unit (for example, Non-Patent Document 1).

CITATION LIST

Patent Document

Patent Document 1: Japanese Laid-Open Patent Publication No. 2007-288774

Non-Patent Document

Non-Patent Document 1: New drivers with active clamping for high-power IGBTs (2000 International Conference on Power, Energy and Electrical Engineering)

SUMMARY OF THE INVENTION

Problem to be Solved by the Invention

However, the invention disclosed in Patent Document 1 has the following problems. In consideration of the fact that accumulation of electric charge corresponding to VDD38 in the capacitor 42 while the MOSFET 30 is OFF leads to flow of current from the capacitor 42 toward the drain terminal of the MOSFET 30 at the time of turn-on so that the gate voltage decreases at a gate resistor 36, the diode 40 is mounted and blocks the current flowing from the capacitor 42 toward the drain terminal of the MOSFET 30 in order to solve the decrease of the gate voltage. To achieve this blocking, a high-withstand-voltage part that can withstand the voltage of VDD38 needs to be used as the diode 40. Therefore, the invention disclosed in Patent Document 1 has problems in terms of cost and reliability.

Likewise, in the configuration disclosed in Non-Patent Document 1 as well, a high-withstand-voltage part needs to be used in order to prevent decrease of the gate voltage. In addition, the following problem arises. That is, in particular, when the IGBT is turned on, minute displacement current flows via a parasitic capacitance of a diode, whereby a voltage drop occurs at a resistor Rin on a buffer input side, and thus the gate voltage decreases and turn-on loss increases.

In order to solve the above problems, an object of the present disclosure is to provide a power conversion device that can prevent decrease of the voltage of a gate drive unit at the time of turn-on, without using a high-withstand-voltage semiconductor part for a voltage feedback unit.

A gate drive circuit unit according to the present disclosure includes: a gate drive unit which applies a gate drive voltage to a control terminal of a semiconductor switching element so as to drive the semiconductor switching element; a voltage feedback unit which is connected to a high-potential main terminal of the semiconductor switching element and which causes a voltage of the high-potential main terminal to be fed back to the gate drive unit, the voltage being generated when the semiconductor switching element is turned off; and a discharge unit forming a path through which electric charge included in the voltage feedback unit is discharged to the high-potential main terminal side of the semiconductor switching element when the semiconductor switching element is turned on.

In addition, a power conversion device according to the present disclosure includes the gate drive circuit and the semiconductor switching element, wherein power inputted from outside is converted into desired power through an ON/OFF operation of the semiconductor switching element.

Effect of the Invention

The gate drive circuit according to the present disclosure can prevent decrease of the voltage of the gate drive unit at the time of turn-on, without using a high-withstand-voltage semiconductor part for the voltage feedback unit.

DESCRIPTION OF EMBODIMENTS

Figure 1:
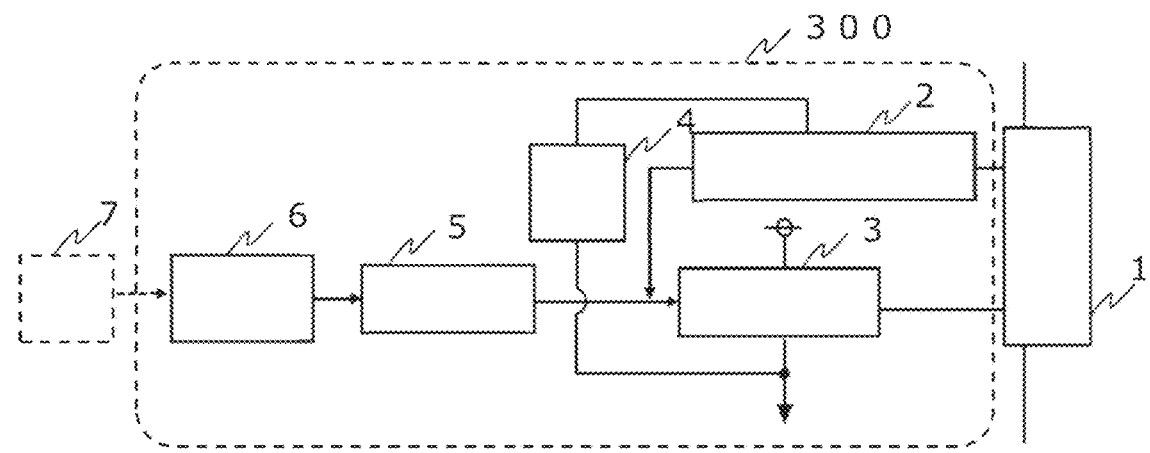
FIG. 1 is a circuit diagram of a gate drive circuit according to embodiment 1 of the present disclosure.

Hereinafter, embodiments will be described with reference to the drawings. The drawings are schematic illustrations, and some configurations are omitted or simplified for convenience of description. The mutual relationship among the sizes and the positions of constituents and the like shown in different drawings is not necessarily accurately rendered and may be changed as appropriate. In the following description, the same constituents are shown while being denoted by the same reference characters, and names and functions of these constituents are also regarded as being the same. Therefore, detailed description about these constituents are sometimes omitted to avoid redundancy.

Embodiment 1

Figure 2:
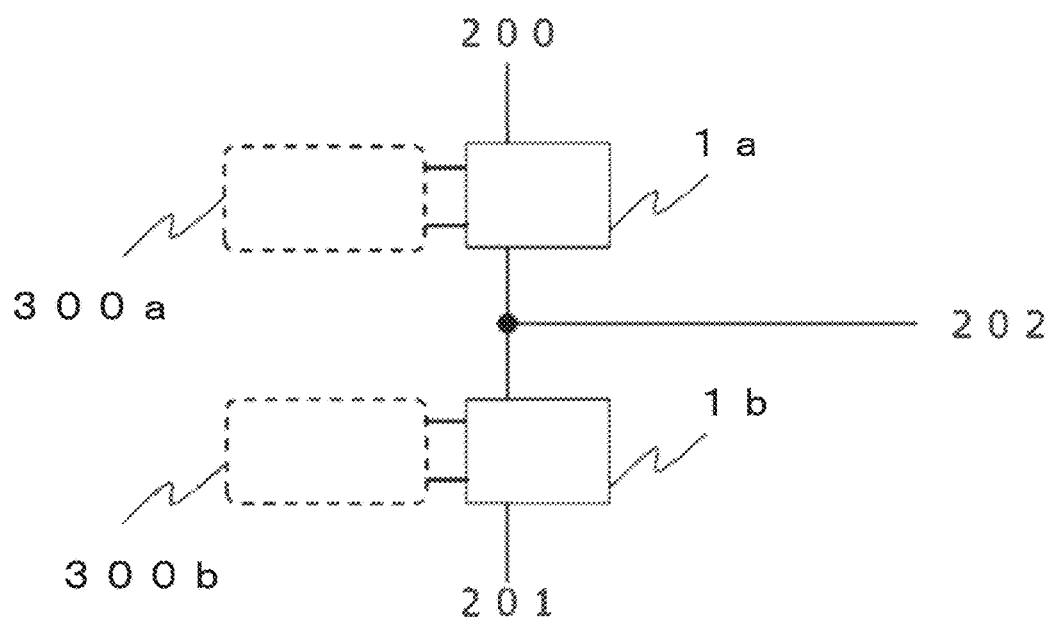
FIG. 2 shows a configuration example of a portion of a power conversion device according to embodiment 1 of the present disclosure.

FIG. 1 is a circuit diagram of a gate drive circuit according to embodiment 1. FIG. 2 shows a configuration example of some of gate drive circuits in a power conversion device. The power conversion device according to embodiment 1 is configured to include semiconductor switching elements 1 (hereinafter, also referred to as semiconductor SW elements 1) and is, for example, a DC-DC converter, an AC-DC converter, a DC-AC inverter, or an AC-AC inverter that converts voltage, current, or power inputted from outside into desired voltage, current, or power. Each of the semiconductor SW elements 1 included in the power conversion device is driven by a corresponding gate drive circuit 300 shown in FIG. 1.

As shown in FIG. 1, the gate drive circuit 300 is configured to include a voltage feedback unit 2, a gate drive unit 3, a discharge unit 4, a first current limitation element 5, and an isolation communication unit 6. The gate drive circuit 300 drives, on the basis of a command from a higher-order logic unit 7, the semiconductor SW element 1 connected to the gate drive circuit 300.

The power conversion device is configured to include one or more of said gate drive circuits 300. FIG. 2 shows an example in which each of the number of the included gate drive circuits 300 and the number of the included semiconductor SW elements 1 is two. In FIG. 2, one of the semiconductor SW elements is represented by 1a, and the other semiconductor SW element is represented by 1b. Also, in FIG. 2, a configuration including one of the gate drive circuits is represented by 300a, and a configuration including the other gate drive circuit is represented by 300b.

As shown in FIG. 2, the gate drive circuit 300a is connected to a gate terminal and a collector (or drain) terminal of the semiconductor SW element 1a, the gate drive circuit 300b is connected to a gate terminal and a collector (or drain) terminal of the semiconductor SW element 1b, and an emitter (or source) terminal of the semiconductor SW element 1a and the collector (or drain) terminal of the semiconductor SW element 1b are connected to each other. The collector (or drain) terminal of the semiconductor SW element 1a is connected to a positive side 200 of a power supply, and an emitter (or source) terminal of the semiconductor SW element 1b is connected to a negative side 201 of the power supply. A connection point between the semiconductor SW element 1a and the semiconductor SW element 1b is an output terminal 202. The gate drive circuit 300a and the gate drive circuit 300b control the respective semiconductor SW elements 1a and 1b to be alternately turned on and off, so as to perform a power conversion operation. Consequently, the desired power can be obtained from the output terminal 202.

Figure 3:
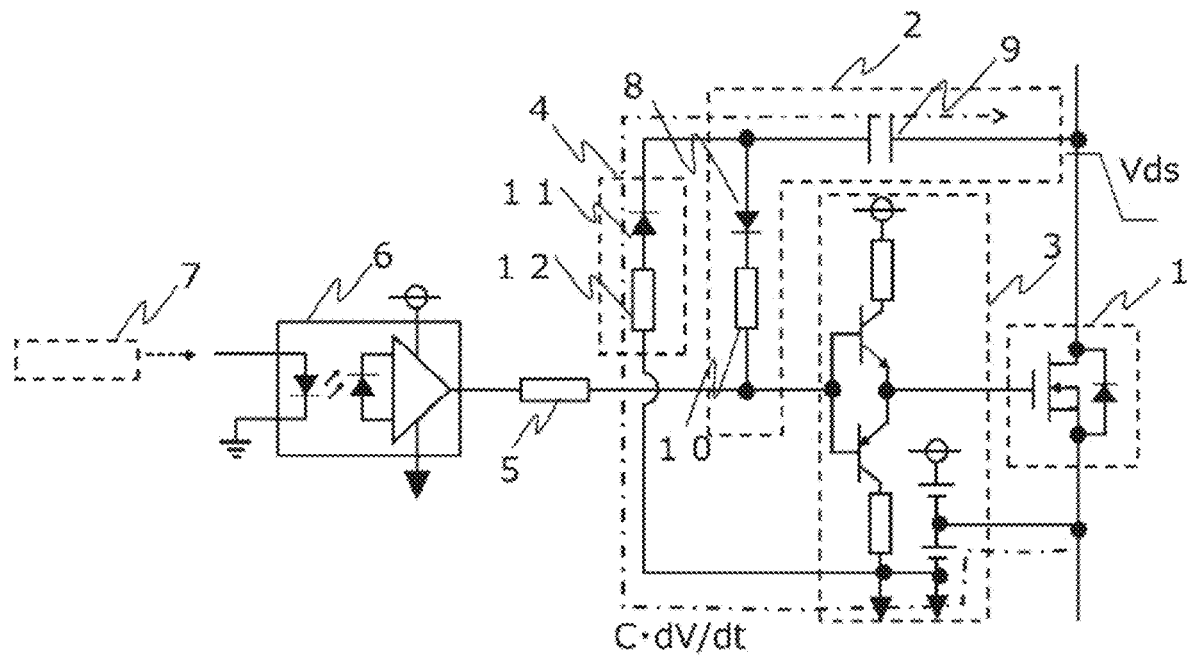
FIG. 3 is a block diagram of the gate drive circuit according to embodiment 1 of the present disclosure.

Here, a configuration of each of the gate drive circuits 300 will be further described with reference to FIG. 3. FIG. 3 is a block diagram of the gate drive circuit according to embodiment 1. As shown in FIG. 3, a metal-oxide-semiconductor field-effect transistor (MOSFET) having an antiparallel diode provided between the source and the drain thereof is used as the corresponding semiconductor SW element 1, for example. A MOSFET made of SiC or a MOSFET made of Si can be used. However, the active clamp technique which is effective in achieving both decrease of switching loss and decrease of surge voltage at the time of turn-off exhibits a stronger effect in the case of using SiC that enables a high-speed switching operation than in the case of using Si. It is also possible to use, for example, a gallium nitride-high mobility transistor (GaN-HEMT) or an insulated-gate bipolar transistor (IGBT) module to which a diode is connected in antiparallel. As the antiparallel diode, the diode built in the MOSFET may be used, or an external diode may be separately provided.

Hereinafter, description will be given with an example in which a MOSFET having an antiparallel diode provided between the source and the drain thereof is used as the semiconductor SW element 1.

The voltage feedback unit 2 is connected to the drain side of the semiconductor SW element 1. The voltage feedback unit 2 can detect the voltage of a high-potential main terminal which is a terminal on the drain side of the semiconductor SW element 1. The voltage feedback unit 2 is configured to cause an increase in the voltage of the high-potential side main terminal to be fed back to the input side of the gate drive unit 3, the voltage being generated when the semiconductor SW element 1 is turned off. Consequently, a function of increasing the gate voltage and decreasing the surge voltage (active clamping function) can be realized.

Specifically, the voltage feedback unit 2 includes a high-withstand-voltage capacitor 9, a first reverse blocking diode 8, and a second current limitation element 10. The capacitor 9 transfers energy from the drain terminal of the semiconductor SW element 1. That is, capacitive coupling occurs at the capacitor 9 from the drain terminal of the semiconductor SW element 1. The first reverse blocking diode 8 has an anode connected to the drain side of the semiconductor SW element 1 and has a cathode connected to the gate drive unit 3 side. Consequently, reverse flow at the time of turn-on can be prevented.

The second current limitation element 10 is a resistor for current limitation. Specifically, the second current limitation element 10 is for adjusting the amount of feedback current for a gate signal necessary for an active clamping operation. The second current limitation element 10 has a resistance value adjusted according to the capacitance of the capacitor 9, the impedance of the first current limitation element 5, the configuration of the gate drive unit 3, and capacitive characteristics of the semiconductor SW element 1. Therefore, although a configuration in which the second current limitation element 10 is provided is employed in embodiment 1, the second current limitation element 10 may be dispensed with depending on circuit design. A constant-voltage diode may be used instead of the capacitor 9. In this case, the constant-voltage diode has an anode connected to the gate drive unit 3 side and has a cathode connected to the drain side of the semiconductor SW element 1. This leads to obtainment of an effect of performing masking on an active clamping operation until the surge voltage reaches a fixed voltage. That is, the active clamping operation is nullified until the surge voltage reaches the fixed voltage, whereby high-speed switching can be realized, and a loss-decreasing effect can be obtained.

The same effect can be obtained also by changing the order of connection of the capacitor 9/constant-voltage diode, the first reverse blocking diode 8, and the second current limitation element 10. In addition, some parts of the second current limitation element 10 may be omitted. Furthermore, although the voltage feedback unit 2 is connected to the input side of the gate drive unit 3 in FIG. 3, the voltage feedback unit 2 may be connected to the output side of the gate drive unit 3. In the case where the voltage feedback unit 2 is connected to the input side of the gate drive unit 3, an active clamping operation can be realized through feedback of voltage corresponding to small current, and thus the circuit size of the voltage feedback unit 2 can be decreased, as compared to the case where the voltage feedback unit 2 is connected to the output side of the gate drive unit 3. Meanwhile, in the case where the voltage feedback unit 2 is connected to the output side of the gate drive unit 3, since the output of the gate drive unit 3 is large current, small noise current is not responded to and the resistance to erroneous operations is improved, as compared to the case where the voltage feedback unit 2 is connected to the input side of the gate drive unit 3.

Figures 4A, 4B, 4C:
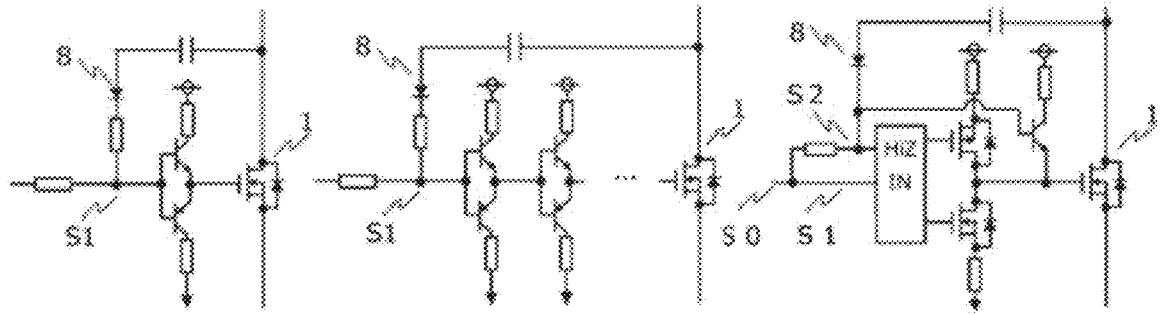
FIG. 4A to 4C shows configuration examples of a buffer circuit according to embodiment 1 of the present disclosure.

The gate drive unit 3 shown receives the value resulting from adding up the output of the first current limitation element 5 and the output of the second current limitation element 10. Furthermore, a buffer circuit supplies a current that allows sufficient charging/discharging to be performed on the input capacitance of the semiconductor SW element 1. In view of an allowable size and necessary responsivity, the buffer circuit is implemented by any of circuits or the like composed of bipolar transistors as shown in FIG. 4A to 4C, for example. Specifically, FIG. 4A shows a one-stage push-pull (totem-pole) circuit obtained by combining an NPN transistor and a PNP transistor. FIG. 4B shows a multi-stage push-pull (totem-pole) circuit configured with two or more stages of said one-stage push-pull (totem-pole) circuits provided in series. FIG. 4C shows a complex buffer circuit composed of: an N-channel MOSFET; a P-channel MOSFET; a pre-driver for driving these MOSFETs; and an NPN transistor with the output thereof being connected in parallel to the MOSFET push-pull source side. Pre-drivers are drive circuits for driving buffer circuits, and the pre-driver shown in FIG. 4C is an example of a pre-driver that can obtain a HiZ state such that both MOSFETs composing the buffer circuit can be simultaneously turned off.

Here, principles of a buffer operation and an active clamping operation in each of the configurations in FIGS. 4A to 4C will be described. The one-stage push-pull circuit shown in FIG. 4A is such that, when a gate drive unit input signal S1 is higher than the base-emitter voltage (for example, 0.7 V) of the NPN transistor, conduction through the NPN transistor occurs so that a positive voltage is outputted. Furthermore, the one-stage push-pull circuit shown in FIG. 4A is such that: in a case where the gate drive unit input signal S1 is at an Lo level, the base-emitter voltage becomes a threshold value or lower (for example, −0.7 V), and thus conduction through the PNP transistor occurs so that a negative voltage is outputted; and meanwhile, in a case where the gate drive unit input signal S1 is at an Hi level, the base-emitter voltage becomes the threshold value or higher (for example, +0.7 V), and thus conduction through the NPN transistor occurs so that a positive voltage is outputted.

In the multi-stage push-pull circuit shown in FIG. 4B, a plurality of stages of circuits each of which is the circuit in FIG. 4A are connected in series, and thus a stronger buffer ability can be obtained than in the one-stage configuration. In this manner, each of the buffer circuits shown in FIGS. 4A and 4B is such that, when the semiconductor SW element 1 is turned off, the collector voltage of the semiconductor SW element 1 increases, and thus current flows through the first reverse blocking diode 8 of the voltage feedback unit 2 so as to raise the gate drive unit input signal S1. Consequently, the gate voltage of the semiconductor SW element 1 is also raised, and an active clamping operation can be realized.

The complex buffer circuit in FIG. 4C is a circuit including: a buffer circuit composed of MOSFETs; and a bipolar transistor provided in parallel to a MOSFET on a source side of the buffer circuit. In the complex buffer circuit, when a signal Lo is inputted from a gate drive unit input signal SO side which is the isolation communication unit 6 side to each of the S1 side and an S2 side at the time of turn-off, the outputs of both of the P-channel MOSFET and the N-channel MOSFET are fixed at Lo. When the semiconductor SW element 1 is turned off in this state, the collector voltage of the semiconductor SW element 1 increases. Then, current flows through the first reverse blocking diode 8 of the voltage feedback unit 2, and the NPN transistor is turned on. Furthermore, a signal HiZ is inputted to the S2 side of the pre-driver, whereby both of the P-channel MOSFET and the N-channel MOSFET enter OFF states. Consequently, the NPN transistor supplies a gate current corresponding to the current of the voltage feedback unit 2, whereby the gate voltage of the semiconductor SW element 1 is raised, and an active clamping operation can be realized. In this complex buffer circuit, voltage-driven MOSFETs are used for the buffer circuit, whereby high-speed drive that is not dependent on the input current in the stage preceding the buffer circuit can be realized. As the buffer circuit composed of MOSFETs, a buffer circuit having a configuration obtained by substituting the NPN transistor in FIG. 4A with the N-channel MOSFET and substituting the PNP transistor in FIG. 4A with the P-channel MOSFET may be used to realize active clamping in the same manner as in FIG. 4A. In this case, a threshold voltage (for example, ±2.5 V) of each of the MOSFETs is higher than a threshold voltage (±0.7 V) of the bipolar transistor, and thus there are: a disadvantage that a higher drive power supply voltage becomes necessary; a disadvantage that the drive speed of the buffer decreases; and other disadvantages.

The first current limitation element 5 is an element for, while limiting circuit current in the isolation communication unit 6, setting an input signal for the gate drive unit 3 to have a value different from the value of an output signal from the isolation communication unit 6 by means of a feedback signal from the voltage feedback unit 2. The first current limitation element 5 has a resistance value adjusted according to the capacitance of the capacitor 9, the impedance of the second current limitation element 10, the configuration of the gate drive unit 3, and the capacitive characteristics of the semiconductor SW element 1.

The isolation communication unit 6 is implemented by an isolator IC having a built-in photocoupler, pulse transformer, or the like which generates, on the basis of a signal transmitted from the higher-order logic unit 7 such as a microcomputer, an ON/OFF command signal while achieving isolation from the higher-order logic unit 7.

The discharge unit 4 is disposed between: the connection point between the capacitor 9 and the first reverse blocking diode 8 of the voltage feedback unit 2; and a power supply potential to be applied to a control terminal when the semiconductor SW element 1 is turned off, for example. The discharge unit 4 is configured to include a second reverse blocking diode 11 and an inrush current suppression element 12. The second reverse blocking diode 11 has an anode connected to the negative potential side of a gate power supply and has a cathode connected to the capacitor 9 side, and the inrush current suppression element 12 is connected so as to be subsequent to or precede the second reverse blocking diode 11. By thus providing the discharge unit 4, electric charge with which the capacitor 9 has been charged in the direction of a gate signal from a collector terminal of the semiconductor SW element 1 while the semiconductor SW element 1 is OFF is discharged as follows when the semiconductor SW element 1 is turned on. That is, at a discharge time constant CR corresponding to a resistance value R of the inrush current suppression element 12 and a capacitance C of the capacitor 9, the electric charge is discharged through the path indicated by the alternate long and short dash line in FIG. 3, i.e., a path for flow to the drain terminal of the semiconductor SW element 1 via the discharge unit 4 from the power supply potential to be applied to the control terminal when the semiconductor SW element 1 is turned off. By setting the discharge time constant CR to be small, high reverse voltage can be prevented from being applied to the first reverse blocking diode 8 when the semiconductor SW element 1 is turned on. Therefore, decrease of the voltage of the gate drive unit 3 at the time of turn-on can be prevented without using a high-withstand-voltage semiconductor part for the voltage feedback unit 2. In addition, since a low-withstand-voltage semiconductor part and a high-withstand-voltage capacitor are used, it is possible to obtain a system requiring lower cost and having higher reliability than in the case of using a high-withstand-voltage semiconductor part. In addition, since upsizing does not occur, loss due to upsizing can also be inhibited.

In embodiment 1, the inrush current suppression element 12 of the discharge unit 4 is implemented by a resistor according to, for example, specifications of the capacitor 9 and a busbar voltage in order to suppress inrush current at the time of turn-on. However, the inrush current suppression element 12 is a design element, and thus, does not necessarily have to be provided. The advantageous effects in embodiment 1 are obtained as long as a path for discharging the electric charge with which the capacitor 9 of the voltage feedback unit 2 has been charged, is ensured. Thus, the anode-side connection destination for the second reverse blocking diode 11 of the discharge unit 4 may be set to, instead of the negative-side potential of the gate power supply, a position that allows obtainment of a one-turn loop for the discharging path. Furthermore, the connection destination for one end of the discharge unit 4 does not have to be the connection point between the capacitor 9 and the first reverse blocking diode 8 of the voltage feedback unit 2 described above, and the one end only has to be connected to the voltage feedback unit 2 from a connection point on the gate drive unit 3 side of the capacitor 9 to the gate drive unit 3.

Figures 5A, 5B:
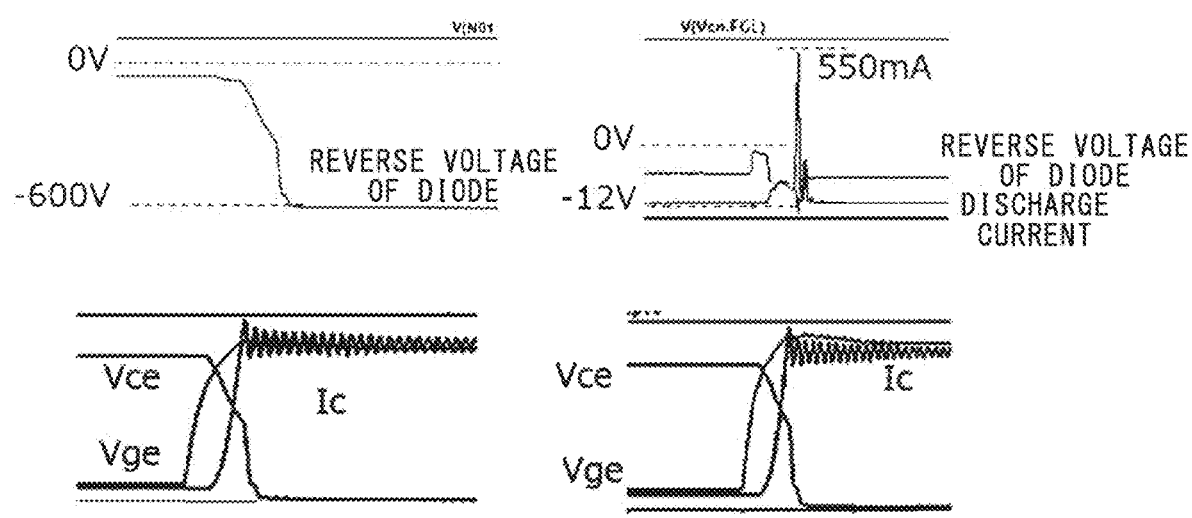
FIGS. 5A and 5B shows results of performing a simulation examination for comparison between the gate drive circuit according to embodiment 1 of the present disclosure and a conventional example.

Here, an application effect will be described by using analysis examination results obtained by a simulation program with integrated circuit emphasis (SPICE). FIGS. 5A and 5B show results of performing a simulation examination in each of the case of presence of the discharge unit 4 and the case of absence of the discharge unit 4 on the basis of the circuit block diagram in FIG. 3. FIG. 5A shows an analysis waveform in the case of absence of the discharge unit 4, and FIG. 5B shows an analysis waveform in the case of presence of the discharge unit 4 in embodiment 1. At the time of turn-on, the busbar voltage was about 600 V, and the current was about 1000 A.

On the upper side of FIG. 5A, the voltage applied to the first reverse blocking diode 8 of the voltage feedback unit 2 is shown. Meanwhile, on the upper side of FIG. 5B, the waveforms of the voltage applied to the first reverse blocking diode 8 of the voltage feedback unit 2 and discharge current flowing through the inrush current suppression element 12 provided to the discharge unit 4 are shown. On the lower side of each of FIG. 5A and FIG. 5B, the waveforms of a gate-emitter voltage Vge, a collector-emitter voltage Vce, and a collector current Ic of the semiconductor SW element 1 driven by the gate drive unit 3 are shown.

In the case of prior art with no discharge unit 4 being provided (in the case of FIG. 5A), the voltage applied to the first reverse blocking diode 8 subsequently to turn-on was fixed at about-600 V with the polarity being opposite to that of the voltage of the capacitor 9. Meanwhile, in the case of providing the discharge unit 4 (in the case of FIG. 5B), the voltage momentarily decreased to −12 V at the time of discharge, but after the discharge, the voltage was stabilized at a value lower, by Vf, than the voltage applied at the time of turn-off. This is because the discharge unit 4 capable of discharging by causing flow of the electric charge with which the capacitor 9 of the voltage feedback unit 2 has been charged while the semiconductor SW element 1 is OFF, is provided with certainty in the gate drive circuit 300 according to embodiment 1 as described above. Regarding the electric charge with which the capacitor 9 of the voltage feedback unit 2 has been charged while the semiconductor SW element 1 is OFF, the discharge unit 4 can discharge the electric charge via the discharging path to the drain terminal when the semiconductor SW element 1 is turned on. As a result, decrease of the voltage of the gate drive unit 3 at the time of turn-on can be prevented without using a high-withstand-voltage semiconductor part for the voltage feedback unit 2.

Figure 6:
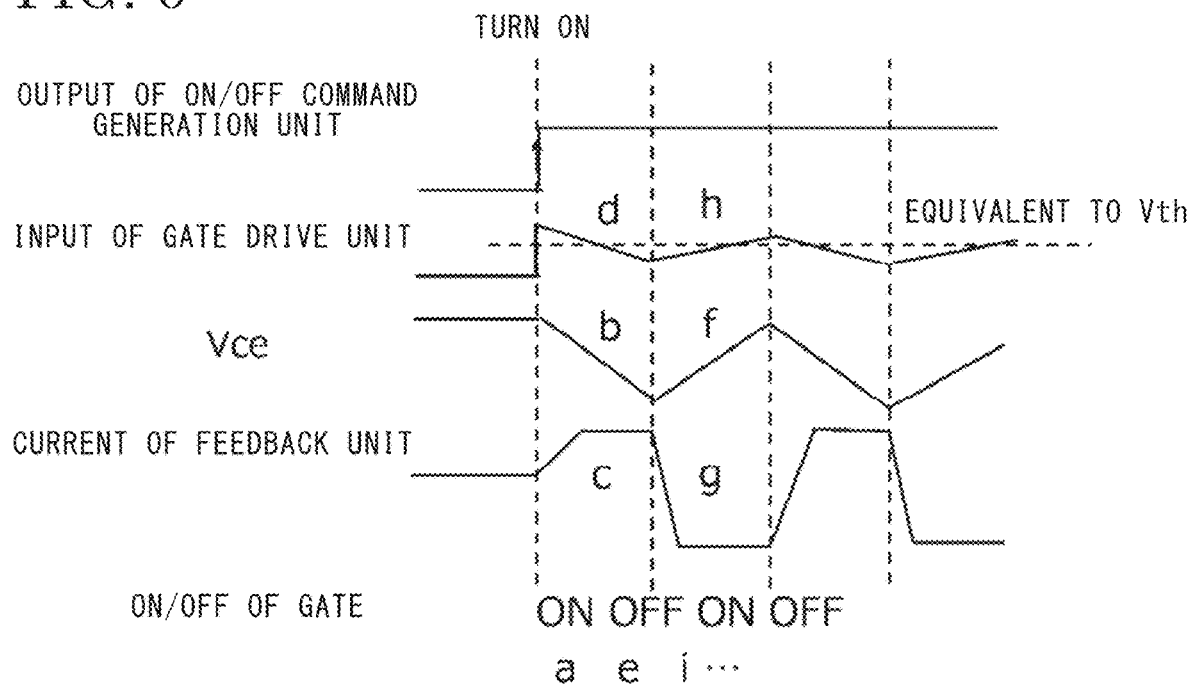
FIG. 6 is a diagram for explaining a mechanism of occurrence of an erroneous operation in the conventional example.

A configuration in which information about the collector voltage of an IGBT is fed back to the input side of a gate drive unit in order to increase responsivity as disclosed in the aforementioned Non-Patent Document 1 has the following problem. That is, in particular, when the IGBT is turned on, minute displacement current flows via a parasitic capacitance of a diode, whereby a voltage drop occurs at a resistor Rin on a buffer input side, and thus the gate voltage decreases and turn-on loss increases. There is also a case where an erroneous operation involving oscillation of the gate voltage occurs at the time of turn-on. Hereinafter, a mechanism of the occurrence of this erroneous operation will be described with reference to FIG. 6. When the gate is turned on ((a) in FIG. 6), Vce decreases (b). Consequently, capacitive displacement current flows in the reverse direction through a reverse blocking diode via Rin (c), the voltage of the input of the gate drive unit drops owing to Rin (d), and the gate enters an OFF state (e). At this time, Vce increases again (f), and current flows in the forward direction of the reverse blocking diode via Rin (g). Consequently, switching from the voltage drop due to Rin to voltage increase occurs, and the input of the gate drive unit increases to a voltage on the positive side of a gate power supply according to an instruction from the higher-order logic unit 7 (h). At this time, the gate is turned on (i). Consequently, the operations described from (a) to (f) are repeated, and an operation in which the gate is repeatedly turned on and off is performed.

Meanwhile, embodiment 1 of the present disclosure ensures the discharging path for discharging the electric charge with which the capacitor 9 of the voltage feedback unit 2 has been charged while the semiconductor SW element 1 is OFF. Therefore, it becomes unnecessary to use any high-withstand-voltage part for the voltage feedback unit 2. In addition, the discharging path forms a path extending from the connection point on the gate drive unit side of the capacitance to the gate drive unit. In other words, the discharge unit 4 ensures a path that bypasses the first current limitation element 5. Therefore, it is possible to prevent an erroneous operation caused by a voltage drop at the first current limitation element 5 as a result of flowing, through the gate drive unit 3, of current for discharging, at the time of turn-on, the electric charge with which the parasitic capacitance of the first reverse blocking diode 8 of the voltage feedback unit 2 has been charged.

In this manner, the gate drive circuit 300 according to embodiment 1 includes: the gate drive unit 3 which applies a gate drive voltage to the control terminal of the semiconductor SW element 1 so as to drive the semiconductor SW element 1; and the voltage feedback unit 2 which is connected to the high-potential main terminal of the semiconductor SW element 1 and which causes an increase in the voltage of the high-potential main terminal to be fed back to the gate drive unit 3, the voltage being generated when the semiconductor SW element 1 is turned off. Consequently, the function of increasing the gate voltage and decreasing surge voltage can be realized.

In addition, the discharge unit 4 is provided. The discharge unit 4 forms a path through which discharge from the capacitance included in the voltage feedback unit 2 is performed when the semiconductor SW element 1 is turned on. Consequently, the electric charge with which the capacitor 9 of the voltage feedback unit 2 has been charged can be caused to flow and can be discharged. Therefore, decrease of the voltage of the gate drive unit 3 at the time of turn-on can be prevented without using a high-withstand-voltage semiconductor part for the voltage feedback unit 2. In addition, current for discharging the electric charge with which the parasitic capacitance of the first reverse blocking diode 8 has been charged can be prevented from flowing to the gate drive unit 3 at the time of turn-on. Therefore, an erroneous operation can be prevented.

In addition, the power conversion device according to embodiment 1 is configured to include one or more of said gate drive circuits 300 and one or more of said semiconductor SW elements 1. Consequently, it is possible to convert voltage, current, or power inputted from outside into desired voltage, current, or power while preventing decrease of the voltage of the gate drive unit 3 at the time of turn-on, without using a high-withstand-voltage semiconductor part.

Embodiment 2

Figure 7:
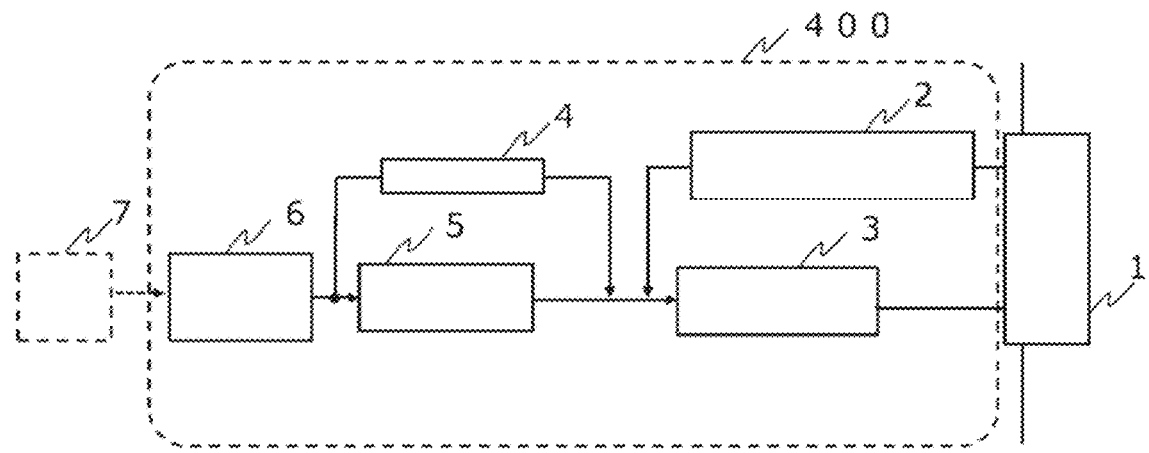
FIG. 7 shows a gate drive circuit according to embodiment 2 of the present disclosure.
Figure 8:
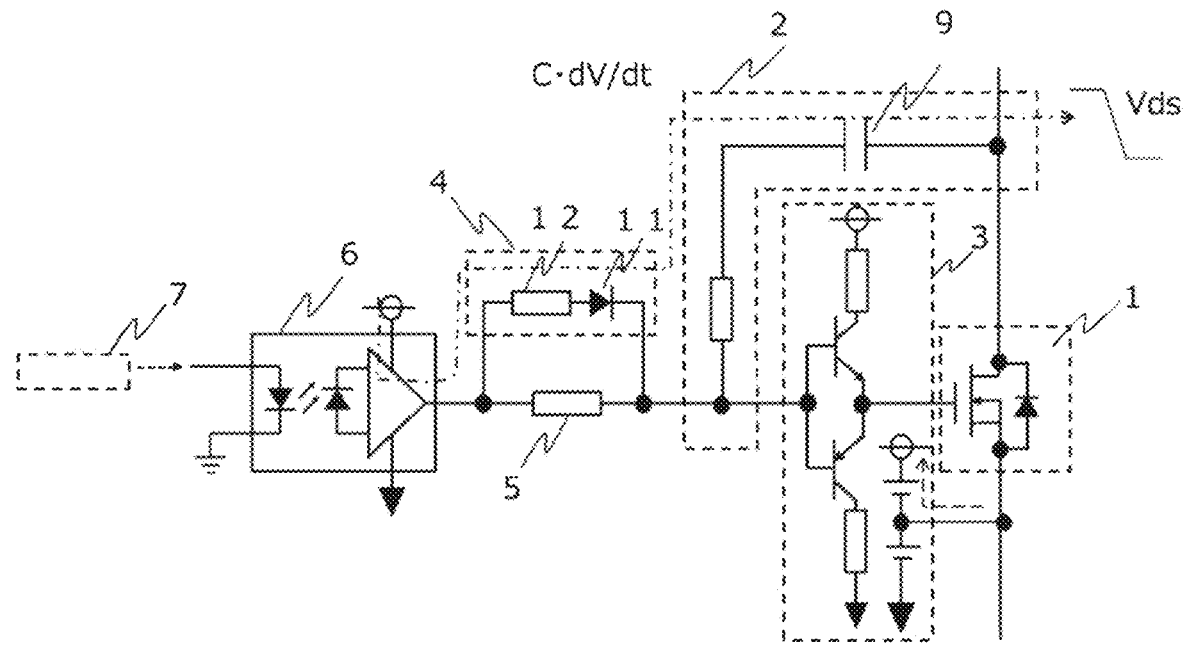
FIG. 8 is a block diagram of the gate drive circuit according to embodiment 2 of the present disclosure.

Hereinafter, a configuration of a power conversion device according to embodiment 2 will be described with reference to FIG. 7 and FIG. 8. FIG. 7 and FIG. 8 show a gate drive circuit 400 according to embodiment 2. As shown in FIG. 7, the power conversion device is configured to include the gate drive circuit 400, and the gate drive circuit 400 includes a voltage feedback unit 2, the gate drive unit 3, a discharge unit 4, the first current limitation element 5, and the isolation communication unit 6. This configuration is similar to that in embodiment 1. Thus, detailed descriptions of the same constituents are omitted, and constituents different from those in embodiment 1 will be described below.

In embodiment 2, the configurations of the voltage feedback unit 2 and the discharge unit 4 have been changed from those in embodiment 1. Specifically, as shown in FIG. 8, the voltage feedback unit 2 has a configuration in which the first reverse blocking diode 8 for preventing reverse flow is not used. In addition, the connection destination for the discharge unit 4 differs from that in embodiment 1.

The discharge unit 4 in embodiment 2 is composed of the second reverse blocking diode 11 and the inrush current suppression element 12. The discharge unit 4 is disposed in parallel to the first current limitation element 5.

The second reverse blocking diode 11 has an anode connected to the output side of the isolation communication unit 6 and has a cathode connected to the input side of each of the voltage feedback unit 2 and the gate drive unit 3. The inrush current suppression element 12 only has to be connected so as to be subsequent to or precede the second reverse blocking diode 11. In FIG. 8, the inrush current suppression element 12 is shown as being connected to the output side of the isolation communication unit 6. The impedance of the inrush current suppression element 12 is set to be lower than the impedance of the first current limitation element 5.

By thus providing the discharge unit 4, the electric charge with which the capacitor 9 has been charged in the direction of a gate signal from the collector terminal while the semiconductor SW element 1 is OFF can be discharged by flowing from the isolation communication unit 6 via the discharge unit 4 to the collector terminal of the semiconductor SW element 1 at the time of turn-on as indicated by the alternate long and short dash line in FIG. 8. By providing the discharge unit 4, the aforementioned path is ensured, and decrease of the voltage of the gate drive unit 3 at the time of turn-on can be prevented without providing a high-voltage semiconductor part as a part of the voltage feedback unit 2. Furthermore, the discharge unit 4 is configured to be disposed in parallel to the first current limitation element 5, and thus a main discharging path bypasses the first current limitation element 5. Therefore, a voltage drop due to the first current limitation element 5 can be inhibited, and an erroneous operation can be inhibited.

The inrush current suppression element 12 of the discharge unit 4 is implemented by a resistor according to, for example, specifications of the capacitor 9 and the busbar voltage in order to suppress inrush current at the time of turn-on. However, the inrush current suppression element 12 is a design element, and thus, does not necessarily have to be provided and may be omitted.

In addition, both the configuration of the discharge unit 4 described in embodiment 1 and the configuration of the discharge unit 4 described in embodiment 2 may be provided, and a configuration may be employed in which the plurality of discharge units 4 are combined. In this case as well, decrease of the voltage of the gate drive unit 3 at the time of turn-on can be prevented in the same manner without using a high-withstand-voltage semiconductor part for the voltage feedback unit 2.

Embodiment 3

Figure 9:
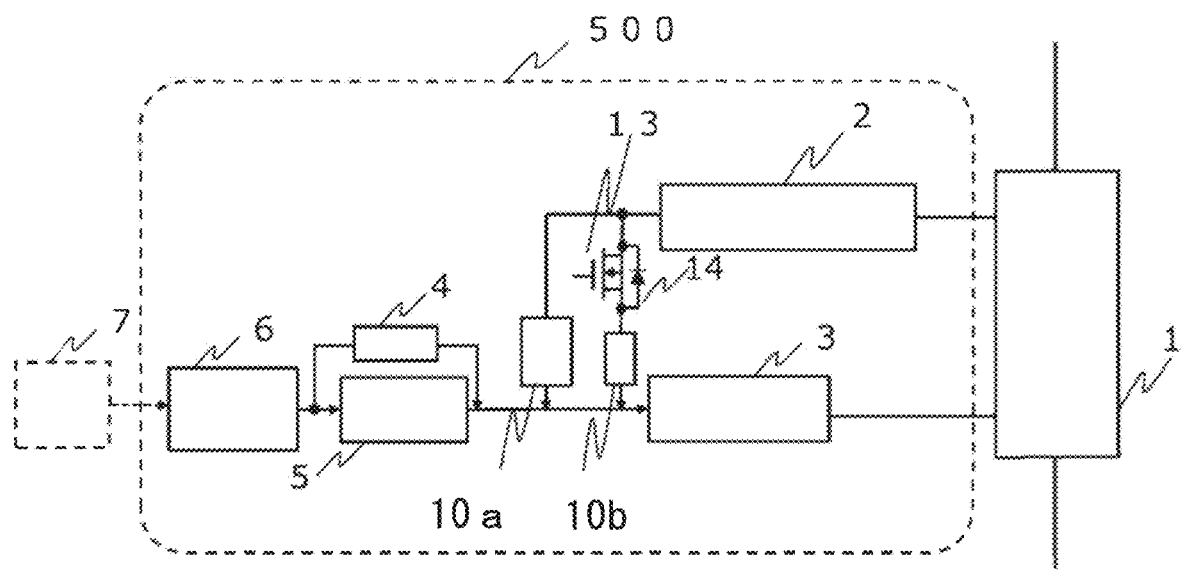
FIG. 9 shows a gate drive circuit according to embodiment 3 of the present disclosure.

Hereinafter, a configuration of a power conversion device according to embodiment 3 will be described with reference to FIG. 9. FIG. 9 shows a gate drive circuit 500 according to embodiment 3. As shown in FIG. 9, the power conversion device is configured to include the gate drive circuit 500, and the gate drive circuit 500 includes the voltage feedback unit 2, the gate drive unit 3, the discharge unit 4, the first current limitation element 5, and the isolation communication unit 6. This configuration is similar to those in embodiments 1 and 2. Thus, detailed descriptions of the same constituents are omitted, and constituents different from those in embodiments 1 and 2 will be described below. Although the discharge unit 4 is shown as having the same configuration as that in embodiment 2, it is possible to employ, as appropriate, the configuration of the discharge unit 4 in embodiment 1 or a configuration obtained by combining the configurations of the discharge units 4 in embodiment 1 and embodiment 2.

In each of embodiments 1 and 2, an invention relating to a gate drive circuit having the active clamping function has been described. Meanwhile, in embodiment 3, a configuration is employed in which the active clamping operation can be optimized by a changeover switch 13.

Specifically, as shown in FIG. 9, the gate drive circuit 500 according to embodiment 3 has, on the low-voltage side of the capacitor 9 of the voltage feedback unit 2, the changeover switch 13 and a second current limitation element 10*b* which are provided in series and a second current limitation element 10*a* provided in parallel to the changeover switch 13 and the second current limitation element 10*b*. The changeover switch 13 is configured by using, for example, a changeover semiconductor switching element 14 (hereinafter, also referred to as changeover semiconductor SW element 14) such as a MOSFET.

The changeover switch 13 can be controlled by predicting a surge voltage to be generated when the semiconductor SW element 1 is turned on, on the basis of information about a current flowing to, or a voltage applied to, the main circuit. For example, the second current limitation element 10*b* is set to have a sufficiently small value, and the second current limitation element 10*a* is set to have a value sufficiently larger than the value of the second current limitation element 10*b*. With this setting, in a case where the surge voltage exceeds an allowable voltage, the changeover semiconductor SW element 14 is controlled with respect to ON/OFF so as to be turned on so that the combined resistance value of the second current limitation elements is set to be a small value determined from the parallel circuit of the second current limitation elements 10*a* and 10*b*. Consequently, the effect of the active clamping function is strengthened, and decrease of surge voltage is realized. Meanwhile, in a case where the surge voltage does not exceed the allowable voltage, the changeover semiconductor SW element 14 is controlled with respect to ON/OFF so as to be turned off so that the combined resistance value of the second current limitation elements is set to the value, of the second current limitation element 10*a*, which is sufficiently large. Consequently, the effect of the active clamping function is weakened, and decrease of loss is realized. That is, the changeover switch 13 enables switching between a state where the feedback function is strengthened and a state where the feedback function is weakened.

Here, although the second current limitation element 10*b* has been described as having a sufficiently small value, the second current limitation element 10*b* may be eliminated to employ a parallel circuit configuration composed of the second current limitation element 10*a* and the changeover switch 13, depending on design. In this case, the strength of active clamping can be significantly changed through ON/OFF of the changeover switch 13. In addition, in a case where, for example, this power conversion device is mounted to an in-vehicle powertrain or electrical component, the active clamping function can also be controlled to be strengthened (enabled)/weakened (disabled) through an ON/OFF operation of the changeover semiconductor SW element 14 according to travel information such as a torque or a rotation speed from a higher-order command unit.

As in this case, when surge voltage is lower than the allowable voltage, the active clamping function is weakened (disabled), whereby rise of the gate voltage due to active clamping can be suppressed, and switching loss can be decreased.

A circuit, for active clamping at the time of turn-off, that achieves both decrease of surge voltage and decrease of loss has been described above. Moreover, by applying the present circuit, the gate voltage is raised also at the timing of recovery of the diode provided in antiparallel to the semiconductor SW element 1, and thus the semiconductor SW element 1 is temporarily turned on so that a minute amount of short-circuit current flows through an arm in the power conversion device. Consequently, it is also possible to decrease a recovery surge voltage.

In order to decrease the recovery surge voltage, the active clamping function is required to be strengthened for raising the gate voltage of the target semiconductor SW element 1 from a negatively-biased state to a threshold voltage Vth. Meanwhile, at the time of turn-off, in a case where the surge voltage is sufficiently lower than the allowable surge voltage, the active clamping function is sometimes desired to be weakened to decrease loss. Embodiment 3 is effective also in the case where the requirement for the active clamping function at the time of recovery and the requirement for the active clamping function at the time of turn-off contradicts with each other in this manner.

Specifically, at the time of turn-off, the changeover switch 13 is controlled to be turned off. Consequently, the combined resistance value of the second current limitation elements is set to a sufficiently large value, whereby the effect of the active clamping function is weakened, and decrease of loss is realized. Meanwhile, at the time of recovery, the changeover switch 13 is controlled to be turned on. Consequently, the combined resistance value of the second current limitation elements is set to a small value, whereby the effect of the active clamping function is strengthened, and decrease of the recovery surge voltage is realized.

In this manner, the following advantageous effect is obtained in addition to the same advantageous effects as those in embodiments 1 and 2. That is, the function can be selectively strengthened (enabled) or weakened (disabled) according to specifications, whereby it is possible to further decrease loss while decreasing surge voltage.

Although the disclosure is described above in terms of various exemplary embodiments, it should be understood that the various features, aspects, and functionality described in one or more of the individual embodiments are not limited in their applicability to the particular embodiment with which they are described, but instead can be applied, alone or in various combinations to one or more of the embodiments of the disclosure. It is therefore understood that numerous modifications which have not been exemplified can be devised without departing from the scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 semiconductor SW element
2 voltage feedback unit
3 gate drive unit
4 discharge unit
5 first current limitation element
6 isolation communication unit
7 higher-order logic unit
8 first reverse blocking diode
9 capacitor
10 second current limitation element
11 second reverse blocking diode
12 inrush current suppression element
13 changeover switch
14 changeover semiconductor SW element
300, 400, 500 gate drive circuit

The invention claimed is:

1. A gate drive circuit comprising:
a gate drive circuitry which applies a gate drive voltage to a control terminal of a semiconductor switching element so as to drive the semiconductor switching element;
a voltage feedback circuitry which is connected to a high-potential main terminal of the semiconductor switching element and which causes a voltage of the high-potential main terminal to be fed back to the gate drive circuitry, the voltage being generated when the semiconductor switching element is turned off; and
a discharge circuitry forming a path through which electric charge included in the voltage feedback circuitry is discharged to the high-potential main terminal side of the semiconductor switching element when the semiconductor switching element is turned on.

2. The gate drive circuit according to claim 1, wherein the voltage feedback circuitry forms a path extending from a connection point on the gate drive circuitry side to the high-potential main terminal of the semiconductor switching element.

3. The gate drive circuit according to claim 1, wherein the discharge circuitry has one end connected to the voltage feedback circuitry.

4. The gate drive circuit according to claim 3, wherein the discharge circuitry has another end connected to a side on which a power supply potential to be applied to the control terminal when the semiconductor switching element is turned off by the gate drive circuitry, is present.

5. The gate drive circuit according to claim 1, wherein the voltage feedback circuitry has at least one of a capacitor or a constant-voltage diode and a reverse blocking diode, and is provided between the high-potential main terminal and an input side or an output side of the gate drive circuitry.

6. The gate drive circuit according to claim 5, wherein the discharge circuitry has one end connected between the at least one of the capacitor or the constant-voltage diode and the reverse blocking diode which compose the voltage feedback circuitry.

7. The gate drive circuit according to claim 1, wherein the voltage feedback circuitry is configured to include at least one of a second current limitation element and a reverse blocking diode which performs rectification so as to cause current to flow in a direction toward the gate drive circuitry from the high-potential main terminal.

8. The gate drive circuit according to claim 1, further comprising
a first current limitation element which sets, on the basis of a feedback signal from the voltage feedback circuitry, an input signal or an output signal of the gate drive circuitry to have a value different from a value of an ON/OFF command signal that is based on a signal from a higher-order logic circuitry, wherein
the discharge circuitry causes discharge, from a capacitance included in the voltage feedback circuitry, through a path that bypasses the first current limitation element.

9. The gate drive circuit according to claim 8, wherein the discharge circuitry is connected in parallel to the first current limitation element.

10. The gate drive circuit according to claim 1, wherein the gate drive circuitry includes one or more stages of buffer circuits composed of bipolar transistors.

11. The gate drive circuit according to claim 1, wherein the gate drive circuitry includes:
a complex buffer circuit having a buffer circuit composed of MOSFETs and a bipolar transistor provided in parallel to a MOSFET on a source side of the buffer circuit.

12. The gate drive circuit according to claim 1, wherein the voltage feedback circuitry includes a changeover semiconductor switching element capable of adjusting a strength of a feedback function.

13. The gate drive circuit according to claim 12, wherein an ON/OFF state of the changeover semiconductor switching element is determined on the basis of information about a current flowing to, or a voltage applied to, a main circuit.

14. The gate drive circuit according to claim 12, wherein an ON/OFF state of the changeover semiconductor switching element is determined on the basis of information from a higher-order command circuitry.

15. The gate drive circuit according to claim 12, wherein the changeover semiconductor switching element is turned on at a timing of recovery of a diode provided in antiparallel to the semiconductor switching element.

16. A power conversion device comprising:
the gate drive circuit according to claim 1; and
the semiconductor switching element, wherein
power inputted from outside is converted into desired power through an ON/OFF operation of the semiconductor switching element.

* * * * *